(12) United States Patent
Lee et al.

(10) Patent No.: US 12,237,669 B2
(45) Date of Patent: Feb. 25, 2025

(54) SEMICONDUCTOR INTEGRATED CIRCUIT

(71) Applicant: Integrated Silicon Solution Inc., Milpitas, CA (US)

(72) Inventors: Kang Min Lee, Milpitas, CA (US); Kwang Kyung Lee, Milpitas, CA (US); Seung Cheol Bae, Milpitas, CA (US); Young Jin Yoon, Milpitas, CA (US); Sang Min Jun, Milpitas, CA (US); Sun Byeong Yoon, Milpitas, CA (US)

(73) Assignee: Integrated Silicon Solution Inc., Milpitas, CA (US)

( * ) Notice: Subject to any disclaimer, the term of this patent is extended or adjusted under 35 U.S.C. 154(b) by 144 days.

(21) Appl. No.: 18/111,662

(22) Filed: Feb. 20, 2023

(65) Prior Publication Data
US 2024/0283440 A1    Aug. 22, 2024

(51) Int. Cl.
*H02H 9/00*    (2006.01)
*H01L 27/02*    (2006.01)
*H03K 17/082*    (2006.01)

(52) U.S. Cl.
CPC ......... *H02H 9/001* (2013.01); *H01L 27/0288* (2013.01); *H03K 17/0822* (2013.01)

(58) Field of Classification Search
CPC .. H01L 27/0255; H01L 27/0288; H02H 9/001
See application file for complete search history.

(56) References Cited

U.S. PATENT DOCUMENTS

2008/0098342 A1*  4/2008  Yoshimoto ......... H03K 19/0016
                                                    716/120
2008/0178020 A1*  7/2008  Ito ........................ G06F 1/3203
                                                    713/320

* cited by examiner

*Primary Examiner* — Jared Fureman
*Assistant Examiner* — Christopher J Clark

(57) ABSTRACT

A semiconductor integrated circuit is provided, including: a first switch circuit; a logic circuit, coupled to the first switch circuit, a first floating diffusion point being defined between the first switch circuit and the logic circuit; a second switch circuit, coupled to the logic circuit, a second floating diffusion point being defined between the second switch circuit and the logic circuit; and a voltage holding circuit, coupled to the first floating diffusion point and the second floating diffusion point, and used to adjust the voltages of the floating diffusion points. The voltage holding circuit increases or decreases the voltage values of the first floating diffusion point and the second floating diffusion point. Thereby, the influence of long recovery time on the semiconductor integrated circuit is improved, and the stability is ensured.

9 Claims, 12 Drawing Sheets

SEMICONDUCTOR INTEGRATED CIRCUIT

BACKGROUND OF THE INVENTION

1. Field of the Invention

The present invention relates generally to a semiconductor integrated circuit (IC), and more particularly, to semiconductor IC with voltage holding circuit.

2. The Prior Arts

In an advanced manufacturing process, the operating voltage of the circuit is generally reduced in order to reduce the power consumption of the circuit. When the circuit operates at a lower voltage, the requirement of low power consumption is achieved. However, such an approach will also greatly reduce the noise tolerance of the circuit. Among these alternatives, the Multiple Threshold Voltages CMOS (MTCMOS) circuit, with the functions of low power consumption and low leakage current without increasing the complexity of circuit design, is a method that has received considerable attention in recent years.

Accordingly, in the case of using the MTCMOS circuit, signal interference will become one of the main factors affecting the function and performance of the circuit, and another important consideration is power consumption. However, the MTCMOS circuit of the zigzag type generally used at present still has the problem of the spurious signal caused by the coupling noise. The spurious signal will be propagated to the next-stage logic gates to cause the logic gates to charge and discharge after receiving this erroneous signal. As a result, it will not only cause excess power consumption, but also cause the MTCMOS circuit to generate a function error and other serious consequences if the signal happens to be the output controlling value of the logic gate.

In addition, the zigzag MTCMOS circuit may have large inrush current and dynamic voltage drop (IR drop) when it is turned on and off, causing the voltage value of the MTCMOS circuit to deviate from the original predetermined target voltage, so that the recovery time for the MTCMOS circuit to return to the normal voltage during normal operation will be longer, resulting in a delay in the operation preparation time of the MTCMOS circuit and the inability to operate stably.

Therefore, the inventors of the present invention provides the present invention after observing the above-mentioned shortcomings.

SUMMARY OF THE INVENTION

A primary objective of the present invention is to provide a semiconductor integrated circuit, which adjusts the voltage of the floating diffusion point by a voltage holding circuit to increase or decrease the voltages of these floating diffusion points, so that the voltage holding circuit can stably drive the logic circuit when the switch circuit fails. Thereby, the influence of large inrush current and dynamic voltage drop (IR drop) on the semiconductor integrated circuit is reduced to ensure stable performance of the semiconductor integrated circuit.

In order to achieve the above objective, the present invention provides a semiconductor integrated circuit, which includes: a first switch circuit; a logic circuit, coupled to the first switch circuit, a first floating diffusion point being defined between the first switch circuit and the logic circuit; a second switch circuit, coupled to the logic circuit, a second floating diffusion point being defined between the second switch circuit and the logic circuit; and a voltage holding circuit, coupled to the first floating diffusion point and the second floating diffusion point, and used to adjust the voltages of the floating diffusion points, and the voltage holding circuit increases or decreases the voltages of the first floating diffusion point and the second floating diffusion point.

Preferably, according to the semiconductor integrated circuit of the present invention, the voltage holding circuit makes the minimum value of the voltage of the first floating diffusion point greater than the maximum value of the voltage of the second floating diffusion point.

Preferably, according to the semiconductor integrated circuit of the present invention, the first switch circuit and the second switch circuit comprise field effect transistors (FET).

Preferably, according to the semiconductor integrated circuit of the present invention, the first switch circuit is a P-type field effect transistor, and the second switch circuit is an N-type field effect transistor.

Preferably, according to the semiconductor integrated circuit of the present invention, the logic circuit includes a first inverting circuit and a second inverting circuit, and the first inverting circuit and the second inverting circuit include a complementary metal-oxide-semiconductor (CMOS) circuit, and the CMOS circuit includes a P-type field effect transistor and an N-type field effect transistor coupled to each other.

Preferably, according to the semiconductor integrated circuit of the present invention, the voltage holding circuit comprises a plurality of diodes.

Preferably, according to the semiconductor integrated circuit of the present invention, the voltage holding circuit comprises a plurality of FET drain feedback bias circuits.

Preferably, according to the semiconductor integrated circuit of the present invention, the voltage holding circuit comprises a plurality of resistors.

Preferably, according to the semiconductor integrated circuit of the present invention, the voltage holding circuit includes a first voltage holding unit and a second voltage holding unit, the first voltage holding unit is coupled to the first floating a diffusion point, the second voltage holding unit is coupled to the second floating diffusion point.

Preferably, according to the semiconductor integrated circuit of the present invention, the voltage holding circuit includes a plurality of control units, the control units are disposed between the voltage holding units and the logic circuit, and the control unit is used to control the ON and OFF of the voltage holding units.

In summary, the semiconductor integrated circuit provided by the present invention mainly adjusts the voltage of the floating diffusion point by the voltage holding circuit to increase or decrease the voltages of these floating diffusion points, so that the voltage holding circuit can stably drive the logic circuit when the switch circuit fails. Thereby, the voltages of the first floating diffusion point and the second floating diffusion point are prevented from changing drastically, the influence of the long recovery time on the operation preparation time of the semiconductor integrated circuit is improved, and the stable operation of the semiconductor integrated circuit is ensured.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1:
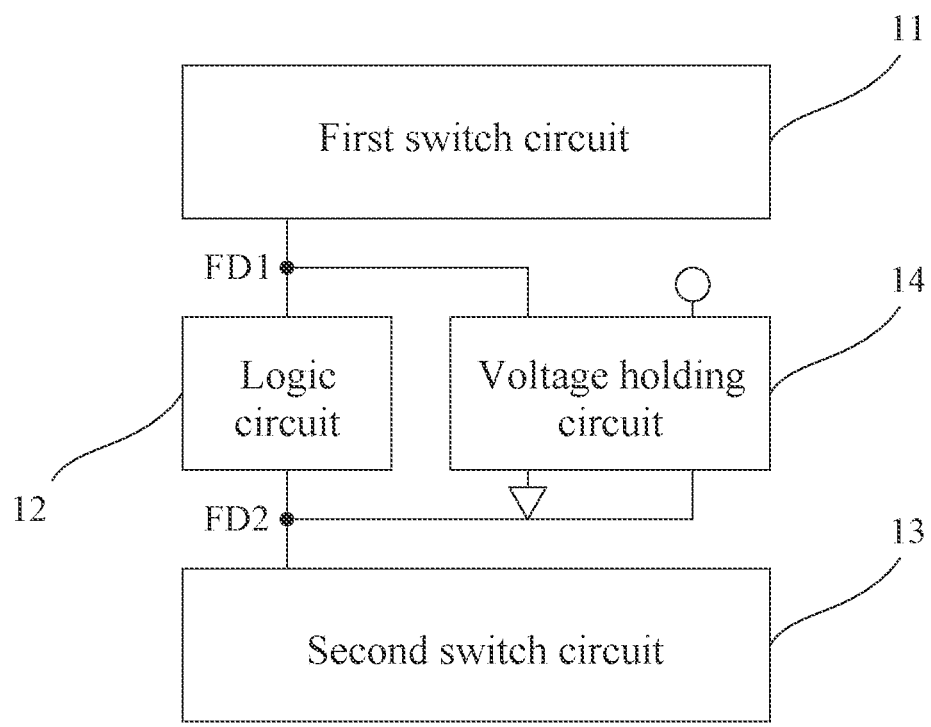
FIG. 1 is a circuit block diagram of a semiconductor integrated circuit according to the present invention.

The inventive concept will be explained more fully hereinafter with reference to the accompanying drawings in which exemplary embodiments of the inventive concept are shown. Advantages and features of the inventive concept and methods for achieving the same will be apparent from the following exemplary embodiments, which are set forth in more details with reference to the accompanying drawings. However, it should be noted that the present inventive concept is not limited to the following exemplary embodiments, but may be implemented in various forms. Accordingly, the exemplary embodiments are provided merely to disclose the inventive concept and to familiarize those skilled in the art with the type of the inventive concept. In the drawings, exemplary embodiments of the inventive concepts are not limited to the specific examples provided herein and are exaggerated for clarity.

The terminology used herein is used to describe particular embodiments only, and is not intended to limit the present invention. As used herein, the singular terms "a" and "the" are intended to include the plural forms as well, unless the context clearly dictates otherwise. As used herein, the term "and/or" includes any and all combinations of one or more of the associated listed items. It will be understood that when an element is referred to as being "connected" or "coupled" to another element, it can be directly connected or coupled to the other element or intervening elements may be present.

Similarly, it will be understood that when an element (e.g., a layer, region, or substrate) is referred to as being "on" another element, it can be directly on the other element or intervening elements may be present. In contrast, the term "directly" means that no intervening elements are present. It should be further understood that when the terms "comprising" and "including" are used herein, it is intended to indicate the presence of stated features, steps, operations, elements, and/or components, but does not exclude one or more other features, steps, operations, elements, components, and/or the presence or addition of groups thereof.

Furthermore, exemplary embodiments in the detailed description are set forth in cross-section illustrations that are idealized exemplary illustrations of the present inventive concepts. Accordingly, the shapes of the exemplary figures may be modified according to manufacturing techniques and/or tolerable errors. Therefore, the exemplary embodiments of the present inventive concept are not limited to the specific shapes shown in the exemplary figures, but may include other shapes that may be produced according to the manufacturing process. The regions illustrated in the figures have general characteristics and are used to illustrate specific shapes of elements. Therefore, this should not be considered limited to the scope of this creative concept.

It will also be understood that, although the terms "first," "second," "third," etc. may be used herein to describe various elements, these elements should not be limited by these terms. These terms are only used to distinguish each element. Thus, a first element in some embodiments could be termed a second element in other embodiments without departing from the teachings of the present creation. Exemplary embodiments of aspects of the present inventive concept illustrated and described herein include their complementary counterparts. Throughout this specification, the same reference numbers or the same designators refer to the same elements.

Furthermore, example embodiments are described herein with reference to cross-sectional and/or planar views, which are illustrations of idealized example illustrations. Accordingly, deviations from the shapes shown, for example, caused by manufacturing techniques and/or tolerances, are expected. Accordingly, the exemplary embodiments should not be considered limited to the shapes of the regions shown herein, but are intended to include deviations in shapes resulting from, for example, manufacturing. Thus, the regions illustrated in the figures are schematic and their shapes are not intended to illustrate the actual shape of a region of a device and are not intended to limit the scope of example embodiments.

As understood by the inventive entities, devices and methods of forming devices according to various exemplary embodiments described herein may be implemented in microelectronic devices, such as integrated circuits, wherein devices according to various exemplary embodiments described herein may be integrated into a single microelectronic device.

Refer to FIG. 1, which is a circuit block diagram of a semiconductor integrated circuit according to the present invention. As shown in FIG. 1, the semiconductor integrated circuit 100 according to the present invention includes a first switch circuit 1, a logic circuit 12, a second switch circuit 13, and a voltage holding circuit 14.

Specifically, as shown in FIG. 1, the first switch circuit 11 of the present invention is coupled to the logic circuit 12, and there is a first floating diffusion point FD1 between the first switch circuit 11 and the logic circuit 12. The first switch circuit 11 is configured to selectively apply a voltage to the first floating diffusion point FD1 according to a first selection signal PVMTHB. In some embodiments, the first switch circuit 11 comprises a field effect transistor (FET). More specifically, the first switch circuit 11 is a P-type field effect transistor, wherein the first selection signal PVMTHB input to the gate of the P-type field effect transistor is used to control the operation of the first switch circuit 11, but the invention is not limited herein.

Specifically, as shown in FIG. 1, the logic circuit 12 can be controlled by the first switch circuit 11 and the second switch circuit 13. In some embodiments, the logic circuit 12 may include a plurality of inverting circuits including a complementary metal-oxide-semiconductor (CMOS) circuit, and the CMOS circuit includes mutually coupled P-type FET and N-type FET.

Specifically, as shown in FIG. 1, the second switch circuit 13 is coupled to the logic circuit 12, and there is a second floating diffusion point FD2 between the second switch circuit 13 and the logic circuit 12. The second switch circuit 13 is configured to selectively apply a voltage to the second floating diffusion point FD2 according to a second selection signal PVMTHL. In some embodiments, the second switch circuit 13 comprises a field effect transistor. More specifically, the second switch circuit 13 is an N-type field effect transistor, wherein the second selection signal PVMTHL input to the gate of the N-type field effect transistor is used to control the operation of the second switch circuit 13, but the invention is not limited herein.

Specifically, as shown in FIG. 1, the voltage holding circuit 14 according to the present invention is coupled to the first floating diffusion point FD1 and the second floating diffusion point FD2, and the voltage holding circuit 14 is used to adjust the voltages of the floating diffusion points to increase or decrease the voltages of the first floating diffusion point FD1 and the second floating diffusion point FD2. More specifically, in some embodiments, the voltage holding circuit 14 may maintain the minimum value of the voltage of the first floating diffusion point FD1 is greater than the maximum value of the voltage of the second floating diffusion point FD2. The voltage holding circuit 14 may include capacitors, the capacitors are respectively coupled to the first floating diffusion point FD1 and the second floating diffusion point FD2, and a predetermined voltage may be stored in the capacitor; thereby, when the first switch circuit 11 and the second switch circuit 13 stop controlling the logic circuit 12, the capacitor can still keep driving the logic circuit 12 to prevent the voltage signal of the logic circuit 12 from drifting and improve the influence of the long recovery time on the operation preparation time of the semiconductor integrated circuit 100, so as to ensure the stable operation of the semiconductor integrated circuit 100.

Figure 2:
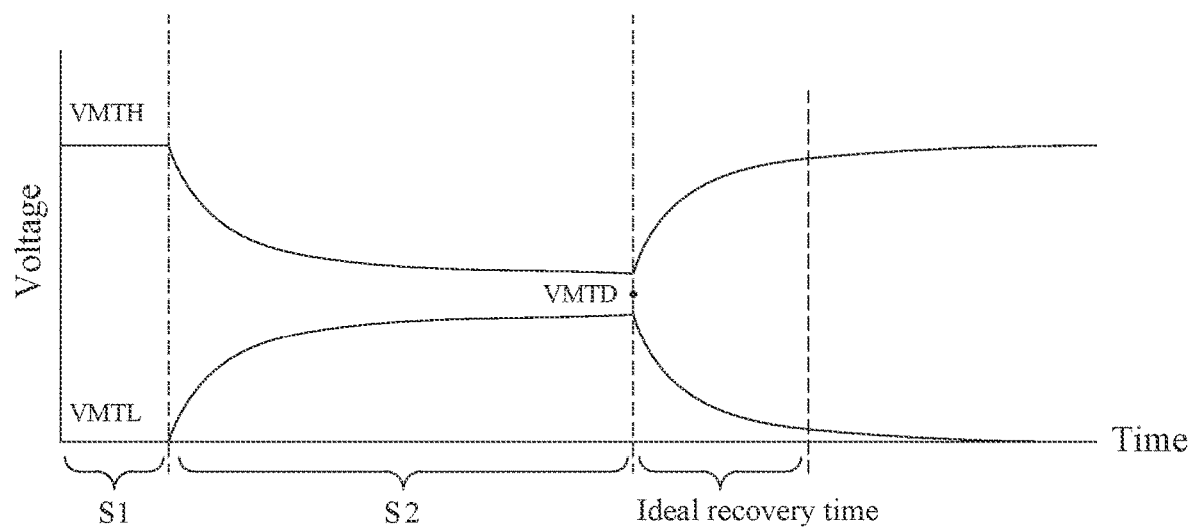
FIG. 2 is an ideal voltage diagram of the semiconductor integrated circuit according to the present invention in an operating state and a voltage-drop state.

Specifically, refer to FIG. 2, in combination with Table 1. FIG. 2 is an ideal voltage diagram of the semiconductor integrated circuit according to the present invention in an operating state and a voltage-drop state. Table 1 is an exemplary illustration of the first selection signal and a second selection signal correspond to the potentials of the operating state S1 and the voltage-drop state S2. Specifically, the semiconductor integrated circuit according to the present invention can have an operating state S1 and a voltage-drop state S2, wherein the operating state S1 represents that the semiconductor integrated circuit is in a normal operation or a standby state, and the voltage-drop state S2 represents the semiconductor integrated circuit in the case of large inrush current and dynamic voltage drop, for example, when the switch circuit of the semiconductor integrated circuit fails or when the semiconductor integrated circuit is turned on, the voltage-drop state S2 may be generated. The invention is not limited herein.

TABLE 1

|  | Operating state S1 | Voltage-drop state S2 |
| --- | --- | --- |
| First selection signal | L | H |
| Second selection signal | H | L |

Specifically, in some embodiments, as shown in Table 1, when the first selection signal PVMTHB of the first switch circuit 11 of the present invention is at a low level (L), and the second selection signal PVMTHL of the second switch circuit 13 is at a high potential (H), the semiconductor integrated circuit is in the operating state S1; when the first selection signal PVMTHB of the first switch circuit 11 of the present invention is at a high level (H), and the second selection signal PVMTHL of the second switch circuit 13 is at a low potential (L), the semiconductor integrated circuit is in a voltage-drop state S2. In addition, as shown in FIG. 2, when the semiconductor integrated circuit 100 of the present invention is in the operating state S1, the voltage of the first floating diffusion point FD1 is at a high voltage threshold VMTH, and the voltage of the second floating diffusion point FD2 is at a low voltage threshold VMTL; when the semiconductor integrated circuit of the present invention is in the voltage-drop state S2, the voltages of the first floating diffusion point FD1 and the second floating diffusion point FD2 will be gradually adjusted from the voltage of the original operating state S1 to approach a voltage-drop voltage VMTD, however the present invention is not limited herein. It is worth mentioning that, as shown in FIG. 2, in an ideal state, when the semiconductor integrated circuit ends the voltage-drop state S2 and returns to the operating state S1, the first floating diffusion point FD1 and the second floating diffusion point FD2 The voltage will gradually recover from the voltage-drop voltage VMTD to the high voltage threshold VMTH and the low voltage threshold VMTL, respectively. The recovery process requires a recovery time. It should be understood that the longer the recovery time is, the operation preparation time for the semiconductor integrated circuit will be.

Figure 3:
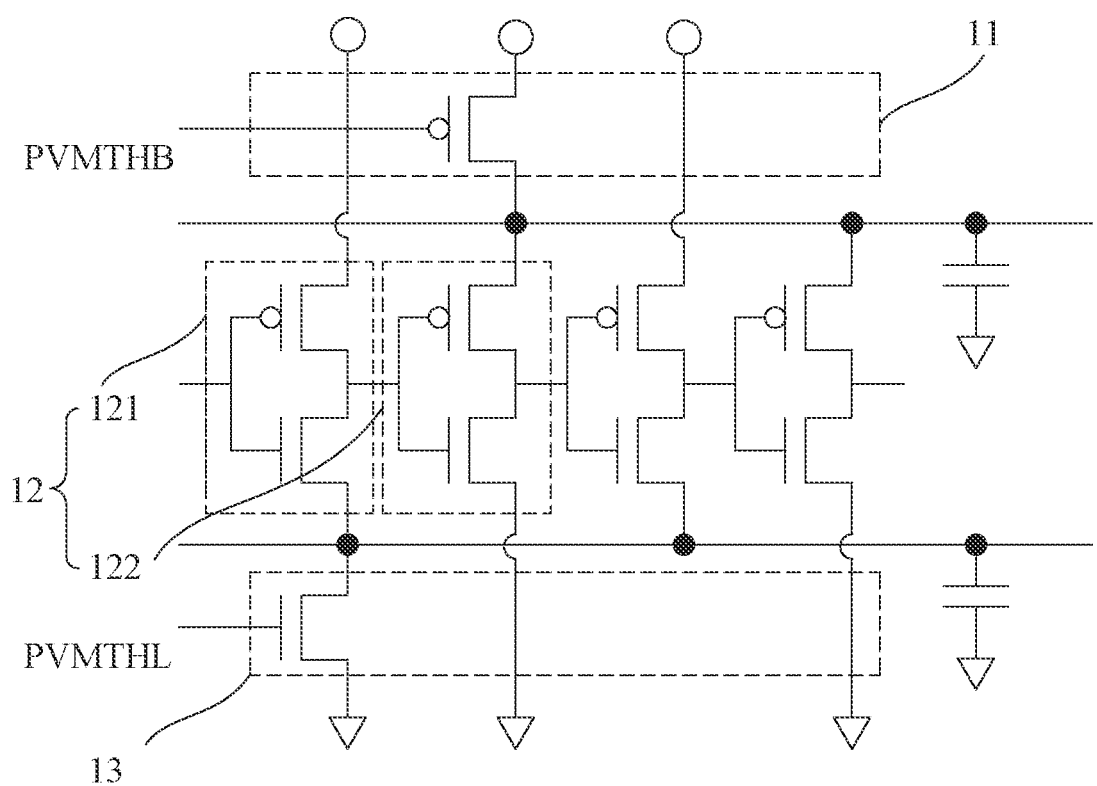
FIG. 3 is a circuit diagram of a semiconductor integrated circuit according to a first comparative example of the present invention.
Figure 4:
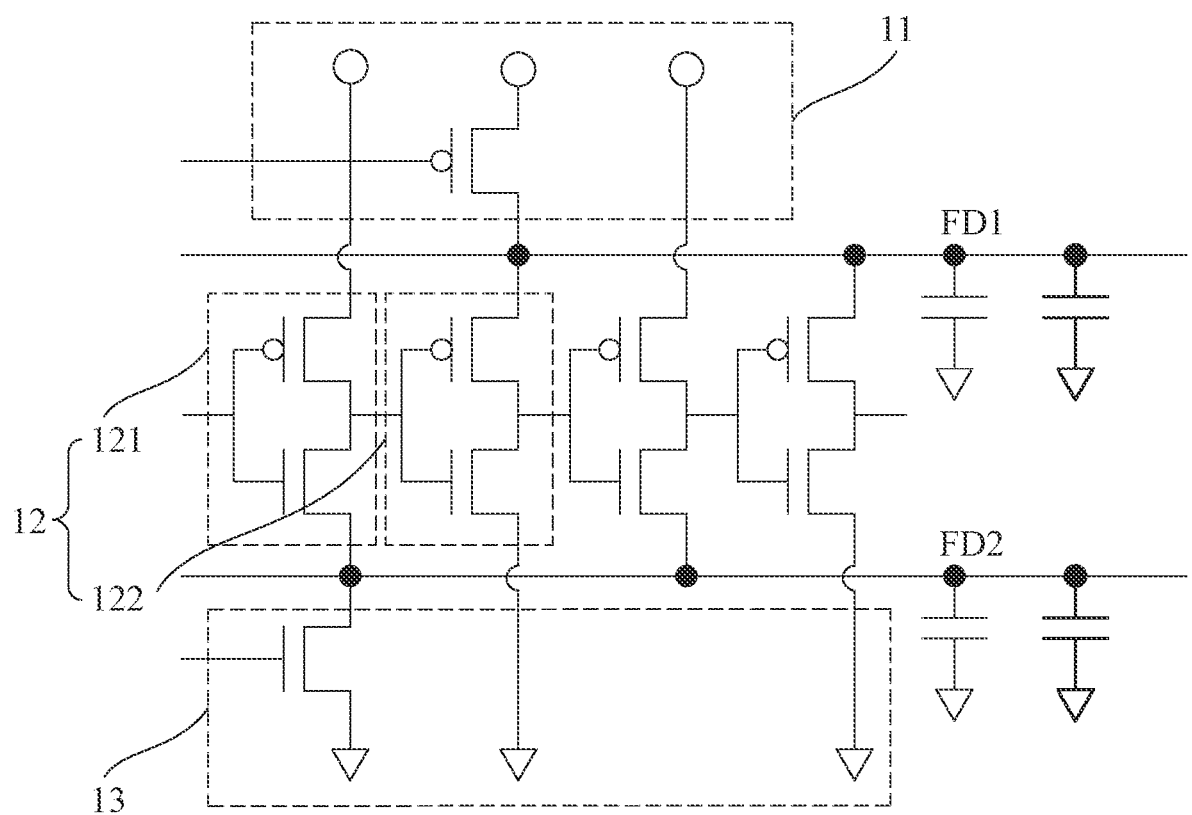
FIG. 4 is a circuit diagram of a semiconductor integrated circuit according to a second comparative example of the present invention.

Refer to FIG. 3 and FIG. 4. FIG. 3 is a circuit diagram of a semiconductor integrated circuit according to a first comparative example of the present invention; FIG. 4 is a circuit diagram of a semiconductor integrated circuit according to a second comparative example of the present invention. Specifically, as shown in FIG. 3, compared with the present invention, the semiconductor integrated circuit 100 of the first comparative example lacks the voltage holding circuit 14 of the present invention. Therefore, the voltage of the floating diffusion point must be stabilized by means of an external capacitor. However, the semiconductor integrated circuit 100 of the first comparative example may have a large inrush current and a dynamic voltage drop (IR drop) when it is turned on and off, causing the voltage of the semiconductor integrated circuit 100 to deviate from the original predetermined target voltage, so that it takes a long recovery time for the semiconductor integrated circuit 100 to return to the normal voltage during normal operation, resulting in a delay in the operation preparation time of the semiconductor integrated circuit 100 and leading to unstable operation. In addition, as shown in FIG. 4, compared with the first comparative example, the semiconductor integrated circuit 100 of the second comparative example includes more external capacitance (parasitic capacitance). It should be noted that when the semiconductor integrated circuit 100 includes too many external capacitors, it will slow down the time for the first floating diffusion point FD1 and the second floating diffusion point FD2 to recover to the high voltage threshold VMTH and the low voltage threshold VMTL, thereby resulting in a longer recovery time is required for returning to the normal voltage in the operation state S1, which also causes a delay in the operation preparation time of the semiconductor integrated circuit 100 and cannot operate stably.

Figure 5:
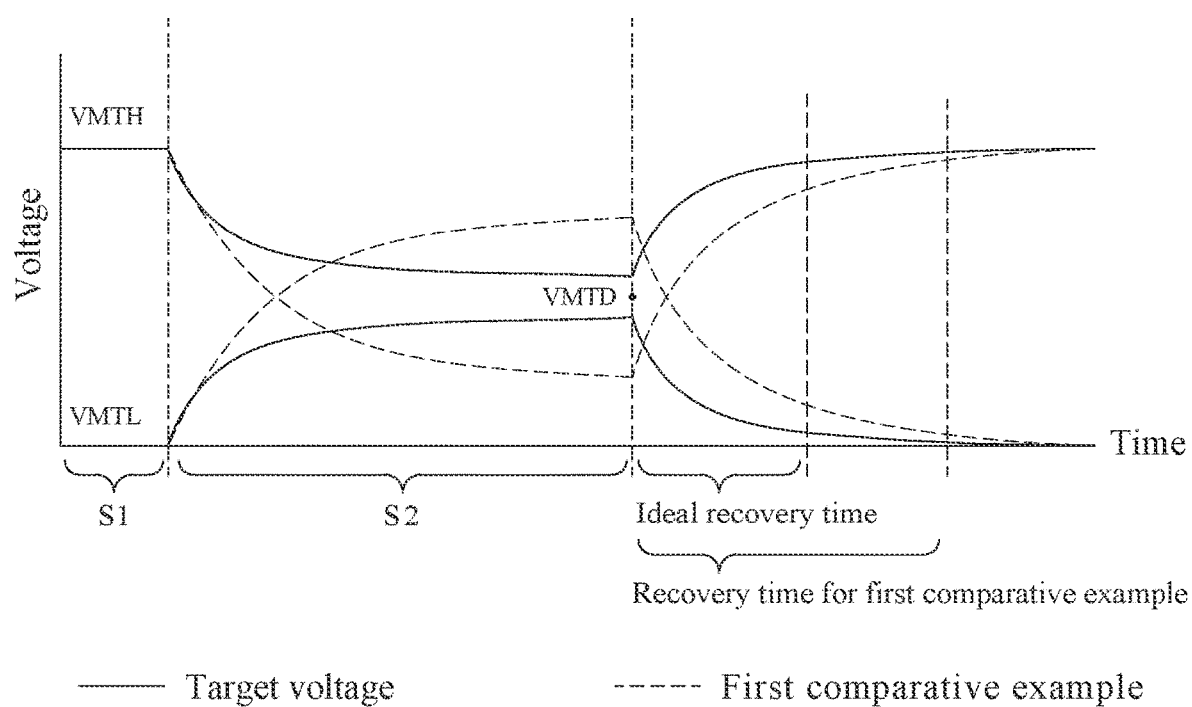
FIG. 5 is a voltage diagram of the semiconductor integrated circuit according to a first comparative example of the present invention in an operating state and a voltage-drop state.
Figure 6:
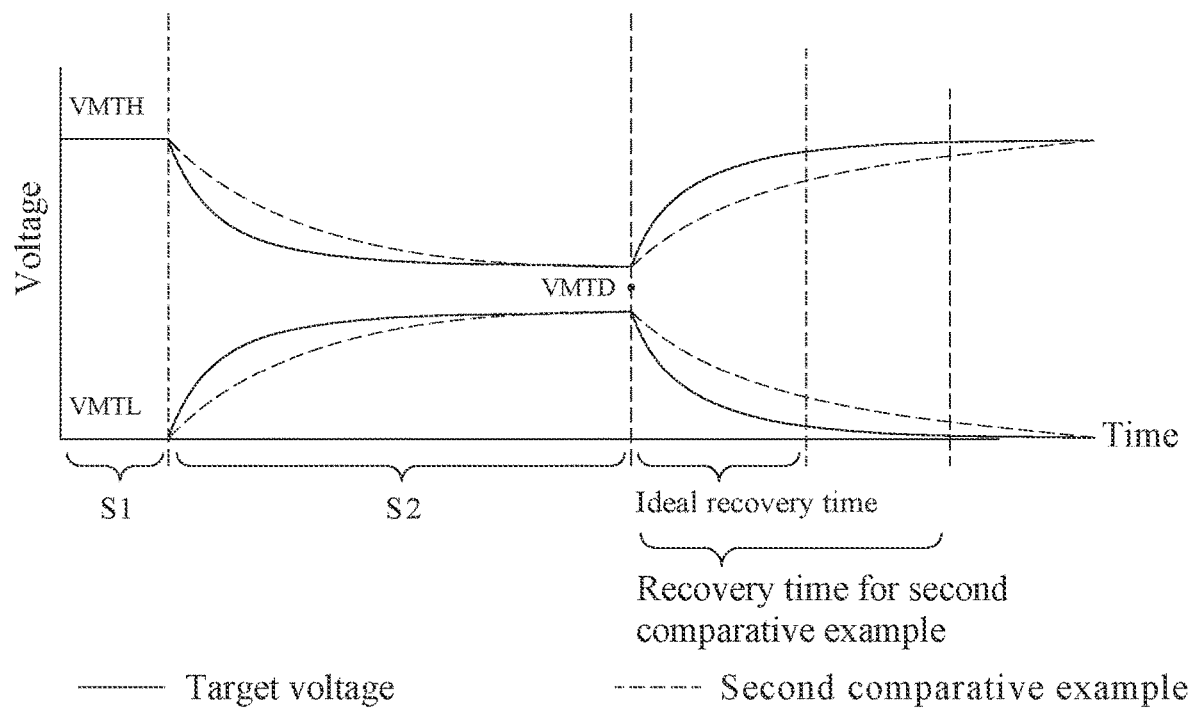
FIG. 6 is a voltage diagram of the semiconductor integrated circuit according to a second comparative example of the present invention in an operating state and a voltage-drop state.

Refer to FIG. 5 and FIG. 6. FIG. 5 is a voltage diagram of the semiconductor integrated circuit according to the first comparative example of the present invention in an operating state and a voltage-drop state; FIG. 6 is a is a voltage diagram of the semiconductor integrated circuit according to the second comparative example of the present invention in an operating state and a voltage-drop state. As shown in FIG. 5, when the semiconductor integrated circuit 100 of the first comparative example enters the voltage-drop state S2, the voltage of the first floating diffusion point FD1 drops from the high voltage threshold VMTH in the original operating state S1 to be lower than the voltage-drop voltage VMTD, and the voltage of the second floating diffusion point FD2 rises from the low-voltage threshold VMTL at the original operating state S1 to be higher than the voltage-drop voltage VMTD, resulting in that when the semiconductor integrated circuit 100 ends the voltage-drop state S2 and enters the operating state S1, it is difficult for the semiconductor integrated circuit 100 of the first comparative example to recover to the normal operating voltage immediately, and a longer recovery time is required. As shown in FIG. 6, when too many external capacitors are provided, the speed for the first floating diffusion point FD1 and the second floating diffusion point FD2 to recover to the high voltage threshold VMTH and the low voltage threshold VMTL respectively will be slowed down, resulting in a longer recovery time to the normal voltage of the operating state S1. More specifically, as shown in FIG. 5 and FIG. 6, compared with the present invention, the first and second comparative examples require twice the recovery time so that the voltage of the first floating diffusion point FD1 can be at a high voltage threshold VMTH, and the voltage of the second floating diffusion point FD2 can be at the low voltage threshold VMTL. It can be understood that when the voltage of the first floating diffusion point FD1 and the second floating diffusion point FD2 changes greatly in the voltage-drop state S2, or the adjustment of the voltages of the first floating diffusion point FD1 and the second floating diffusion point FD1 slows down due to too many external capacitors, it will take a long recovery time to restore the normal voltage to the operating state S1, resulting in a delay in the operation preparation time of the semiconductor integrated circuit 100 of the first comparative example so that the stable operation cannot be performed.

First Embodiment

Hereinafter, the first embodiment of the semiconductor integrated circuit 100 of the present invention will be described with reference to the drawings.

Figure 7:
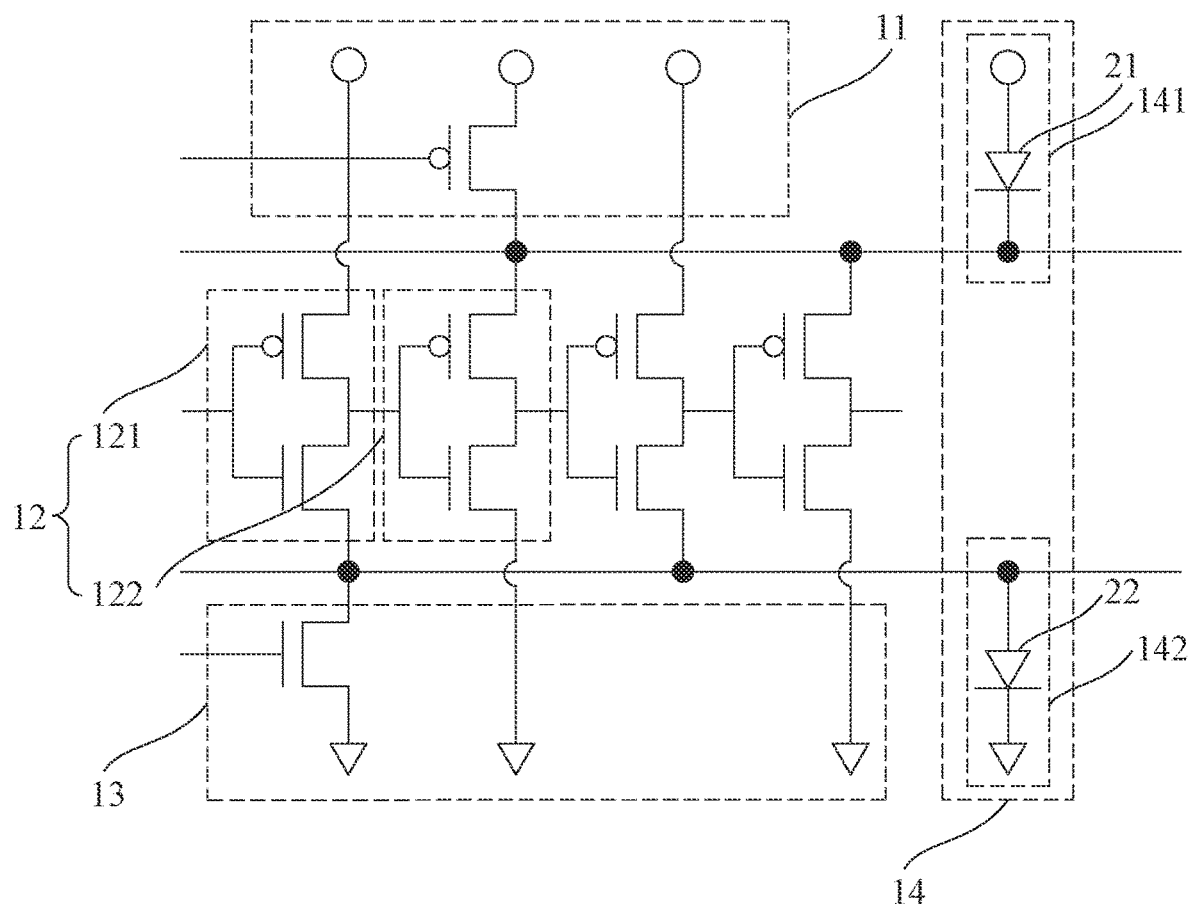
FIG. 7 is a circuit diagram of a semiconductor integrated circuit according to the first embodiment of the present invention.

Refer to FIG. 7, which is a circuit diagram of a semiconductor integrated circuit according to the first embodiment of the present invention. As shown in FIG. 7, the logic circuit 12 according to the first embodiment of the present invention includes a first inverting circuit 121 and a second inverting circuit 122, and the first inverting circuit 121 and the second inverting circuit 122 respectively include a CMOS circuit. The CMOS circuit includes a P-type FET and an N-type FET coupled to each other. The first inverting circuit 121 and the second inverting circuit 122 are configured to receive opposite potential signals to form a zig-zag type CMOS circuit, which can significantly reduce the leakage current generated by the logic circuit 12 during the standby period at S1 in the operating state. Since the zigzag CMOS circuit is well known to those skilled in the art, it will not be repeated here.

Figure 8:
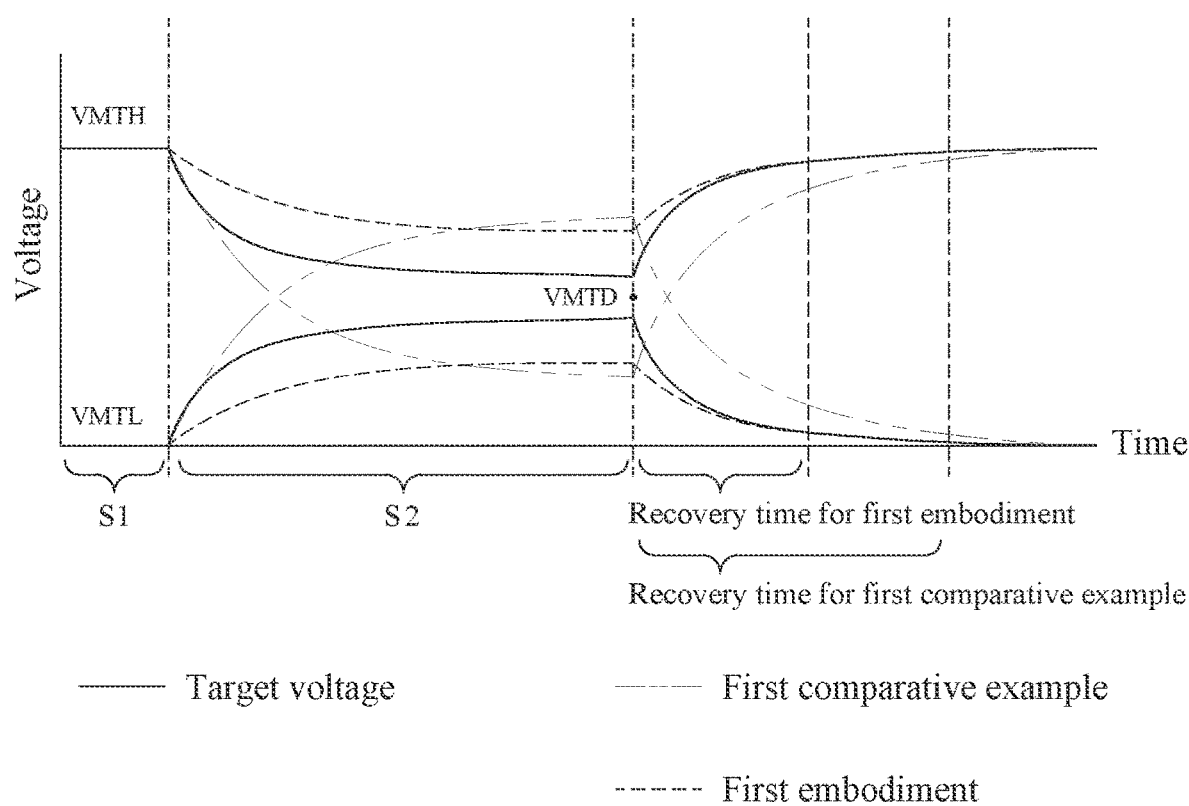
FIG. 8 is a voltage diagram of the semiconductor integrated circuit according to the first embodiment of the present invention in an operating state and a voltage-drop state.

Refer to FIG. 7 and FIG. 8. FIG. 8 is a voltage diagram of the semiconductor integrated circuit according to the first embodiment of the present invention in an operating state and a voltage-drop state. As shown in FIG. 7, the voltage holding circuit 14 according to the first embodiment of the present invention includes a first voltage holding unit 141 and a second voltage holding unit 142, wherein the first voltage holding unit 141 is coupled to the first floating diffusion point FD1, the second voltage holding unit 142 is coupled to the second floating diffusion point FD2. The voltage holding circuit 14 according to the first embodiment of the present invention comprises a plurality of diodes, and the diodes are labelled as first diode 21 and second diode 22, respectively. Specifically, in this embodiment, one ends of the diodes are coupled to the first floating diffusion point FD1 and the second floating diffusion point FD2 respectively, and the other ends of the diodes are provided with a predetermined voltage or grounded. It can be understood that when the voltages of the first floating diffusion point FD1 and the second floating diffusion point FD2 are lower than the predetermined voltage or greater than 0V, the diodes will be converted from the original reverse biased state to the forward biased state, and when the semiconductor integrated circuit 100 is in the voltage-drop state S2, the logic circuit 12 can still be driven to prevent the voltage signal of the logic circuit 12 from drifting, and to ensure that the voltage of the first floating diffusion point FD1 and the voltage of the second floating diffusion point FD2 satisfy the target voltages.

As shown in FIG. 8, when the semiconductor integrated circuit 100 enters the voltage-drop state S2, since the diodes can still keep driving the logic circuit 12, the voltage of the first floating diffusion point FD1 in the voltage-drop state S2 will not drop below the voltage-drop voltage VMTD, and the voltage of the second floating diffusion point FD2 will not rise above the voltage-drop voltage VMTD in the voltage-drop state S2. Therefore, in the first embodiment, the recovery time of the semiconductor integrated circuit 100 when switching between the voltage-drop state S2 and the operating state S1 conforms to the ideal model. It is obvious that the semiconductor integrated circuit 100 of the second embodiment can guarantee that, in the voltage-drop state S2, the voltages of the first floating diffusion point FD1 and the second floating diffusion point FD2 will not change significantly, thereby, achieving the effect of improving the stability.

Other examples of the semiconductor integrated circuit 100 are provided below to make possible variations more clearly understood by those skilled in the art to which the present invention pertains. Elements designated by the same reference numerals as in the above-described embodiments are substantially the same as those described above with reference to FIGS. 1-8. The same elements, features, and advantages as those of the semiconductor integrated circuit 100 will not be described again.

Figure 9:
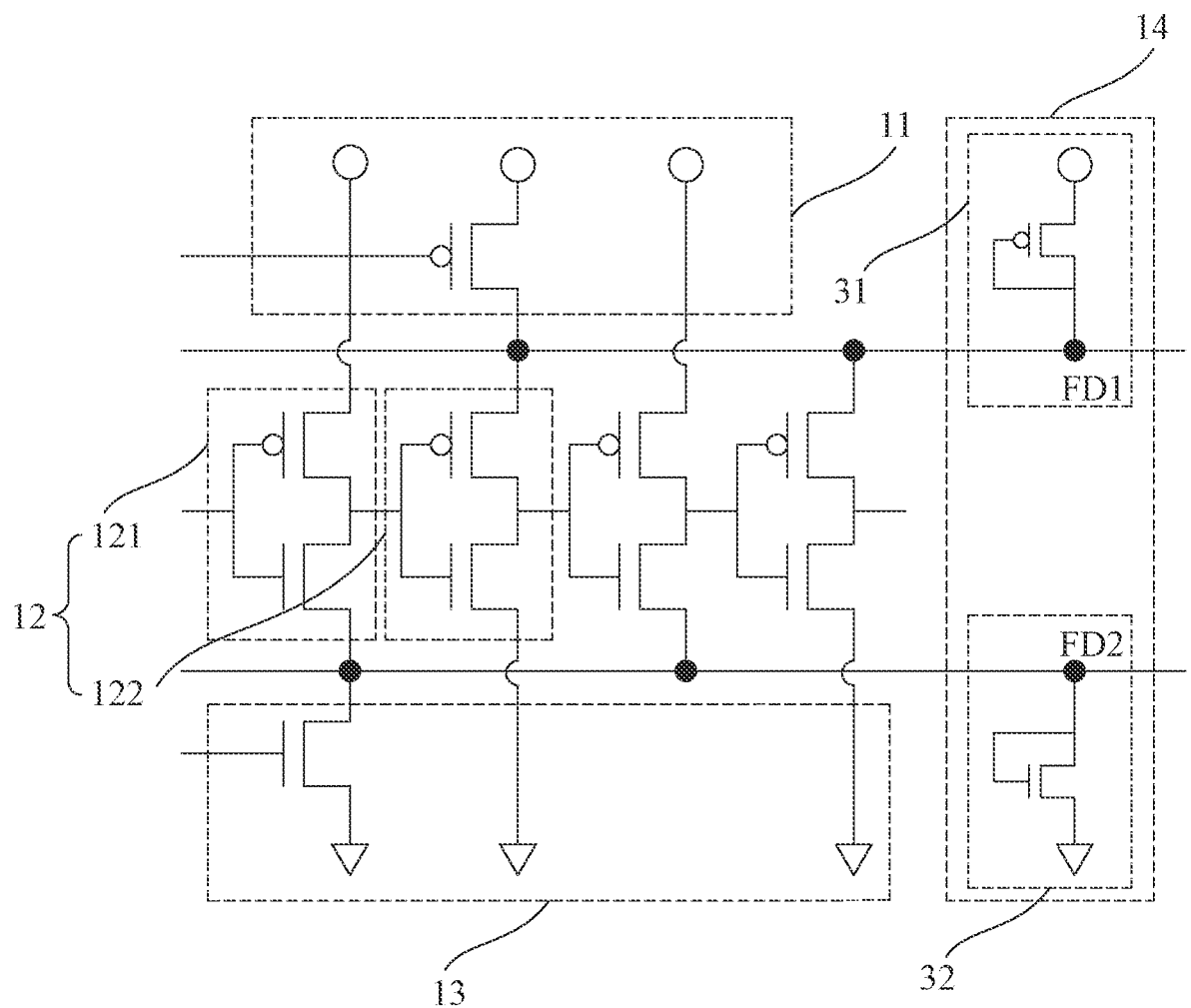
FIG. 9 is a circuit diagram of a semiconductor integrated circuit according to a second embodiment of the present invention.

Refer to FIG. 9, wherein FIG. 9 is a circuit diagram of a semiconductor integrated circuit according to a second embodiment of the present invention. As shown in FIG. 9, compared with the first embodiment, the voltage holding circuit 14 according to the second embodiment of the present invention comprises a plurality of drain feedback bias circuits formed by field effect transistors. The drain feedback bias circuits are a first FET drain feedback bias circuit 31 and a second FET drain feedback bias circuit 32, respectively. Specifically, in the present embodiment, one ends of the FET drain feedback bias circuits are respectively coupled to the first floating diffusion point FD1 and the second floating diffusion point FD2, and the other ends of the FET drain feedback bias circuit are provided with a predetermined voltage or grounded. It can be understood that when the voltages of the first floating diffusion point FD1 and the second floating diffusion point FD2 are less than the predetermined voltage or greater than 0V, the FET drain feedback bias voltage will be converted from the original cut-off state to saturation state. As such, the logic circuit 12 is still driven by the semiconductor integrated circuit 100 when the semiconductor circuit 100 is in the voltage-drop state S2, so as to prevent the voltage signal of the logic circuit 12 from drifting, and to ensure that the voltage of the first floating diffusion point FD1 and the voltage of the second floating diffusion point FD2 satisfy the target voltages, which makes the recovery time of the semiconductor circuit 100 of the second embodiment conform to an ideal model when switching between the voltage-drop state S2 and the operating state S1, thereby achieving the effect of improving stability. The circuits and other characteristics used in the semiconductor integrated circuit 100 of the second embodiment are similar to those of the first embodiment, and are not repeated here.

Figure 10:
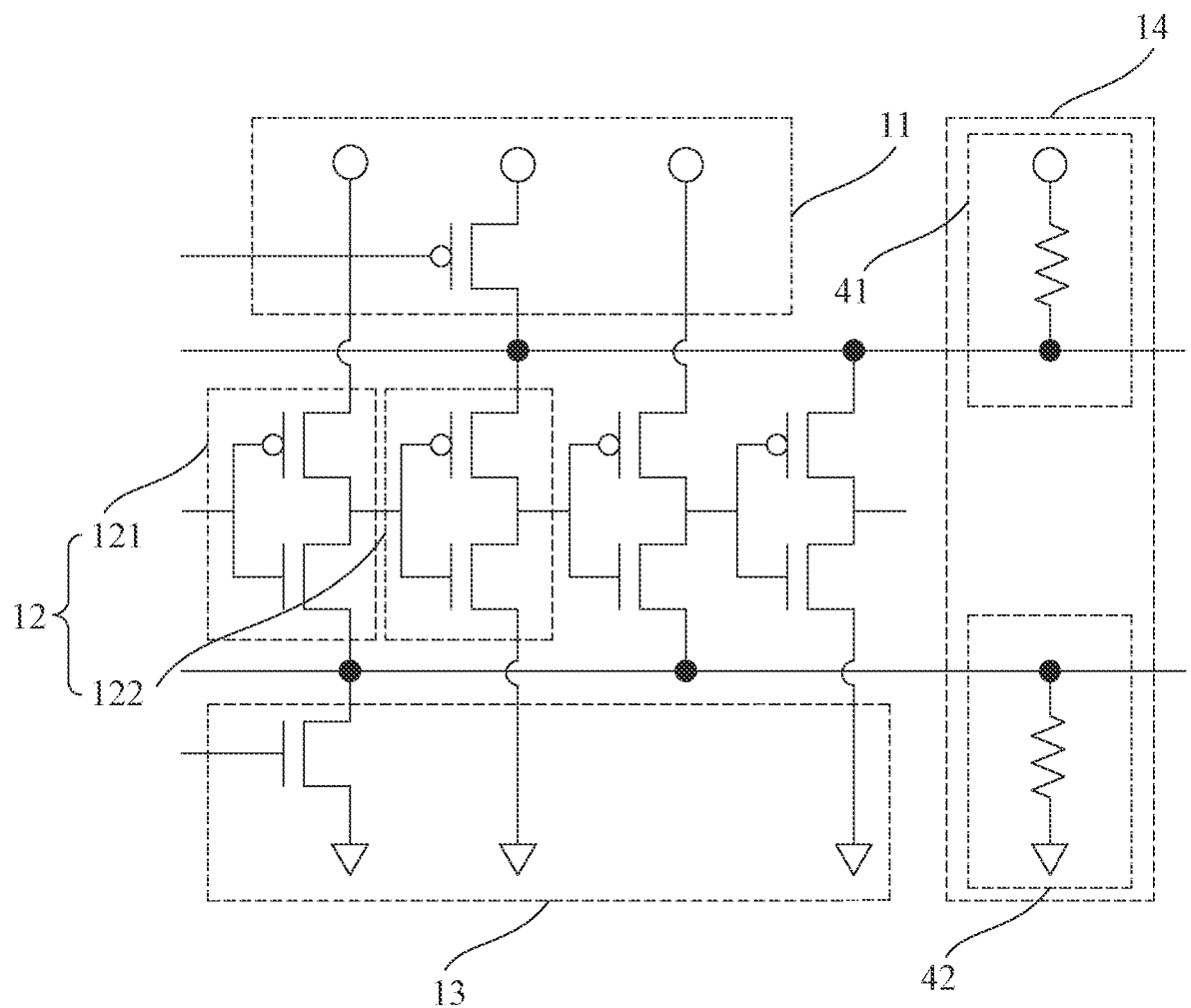
FIG. 10 is a circuit diagram of a semiconductor integrated circuit according to a third embodiment of the present invention.

Refer to FIG. 10. FIG. 10 is a circuit diagram of a semiconductor integrated circuit according to a third embodiment of the present invention. As shown in FIG. 10, compared with the first embodiment, the voltage holding circuit 14 of the third embodiment of the present invention comprises a plurality of resistors, and the resistors are labelled as a first resistor 41 and a second resistor 42 respectively. Specifically, in the present embodiment, one ends of the resistors are coupled to the first floating diffusion point FD1 and the second floating diffusion point FD2 respectively, and the other ends of the resistors are provided with a predetermined voltage or grounded. It can be understood that when the voltages of the first floating diffusion point FD1 and the second floating diffusion point FD2 are lower than the predetermined voltage or greater than 0V, the other ends of the resistors will conduct current to or from the first floating diffusion point FD1 and the second floating diffusion point FD2, Further, the logic circuit 12 is still driven by the semiconductor circuit 100 when the semiconductor circuit 100 is in the voltage-drop state S2, so as to prevent the voltage signal of the logic circuit 12 from drifting, and to ensure that t the voltage of the first floating diffusion point FD1 and the voltage of the second floating diffusion point FD2 satisfy the target voltages to achieve the effect of improving stability. The circuits and other characteristics used in the semiconductor integrated circuit 100 of the fourth embodiment are similar to those of the first embodiment, and are not repeated here.

Figure 11:
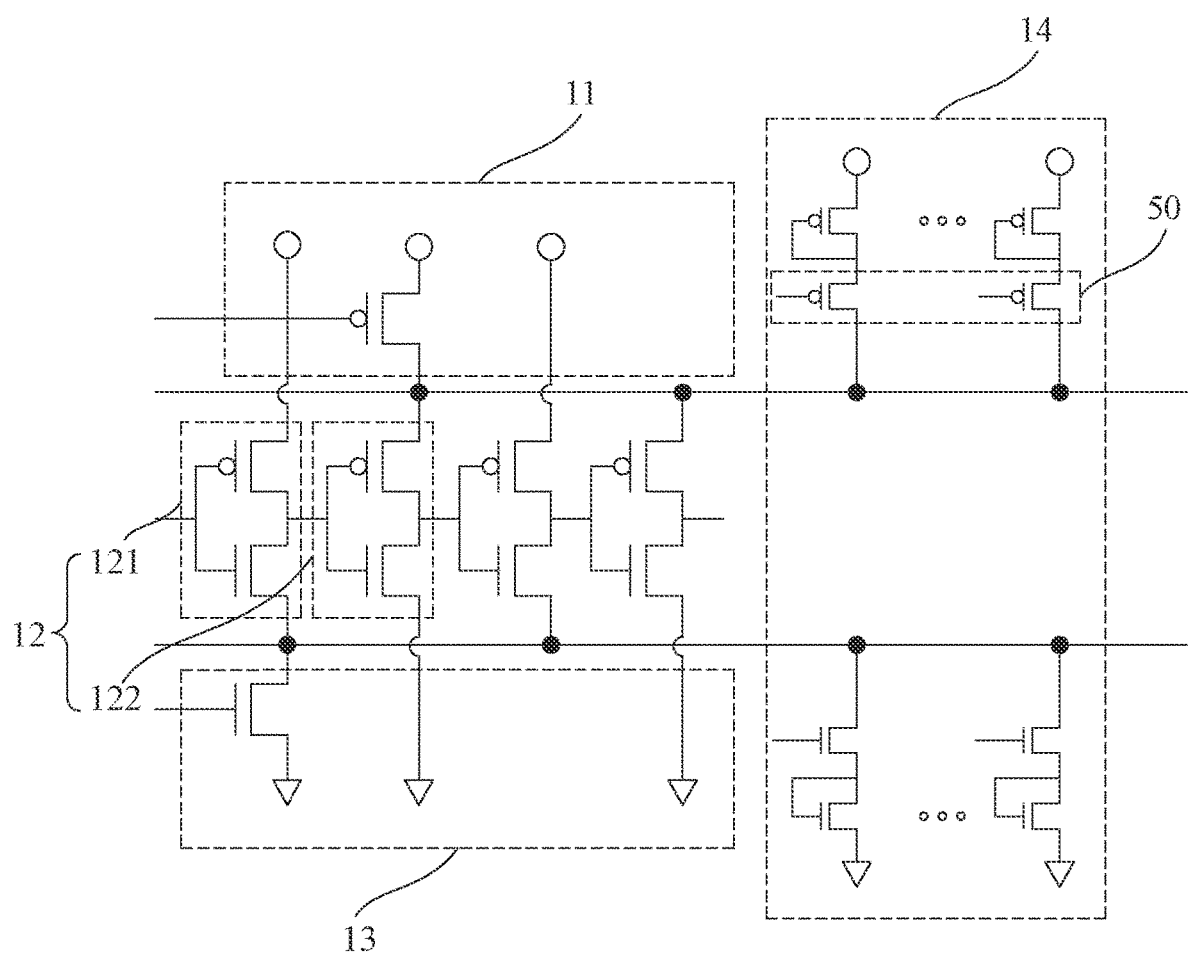
FIG. 11 is a circuit diagram of a semiconductor integrated circuit according to a fourth embodiment of the present invention.
Figure 12:
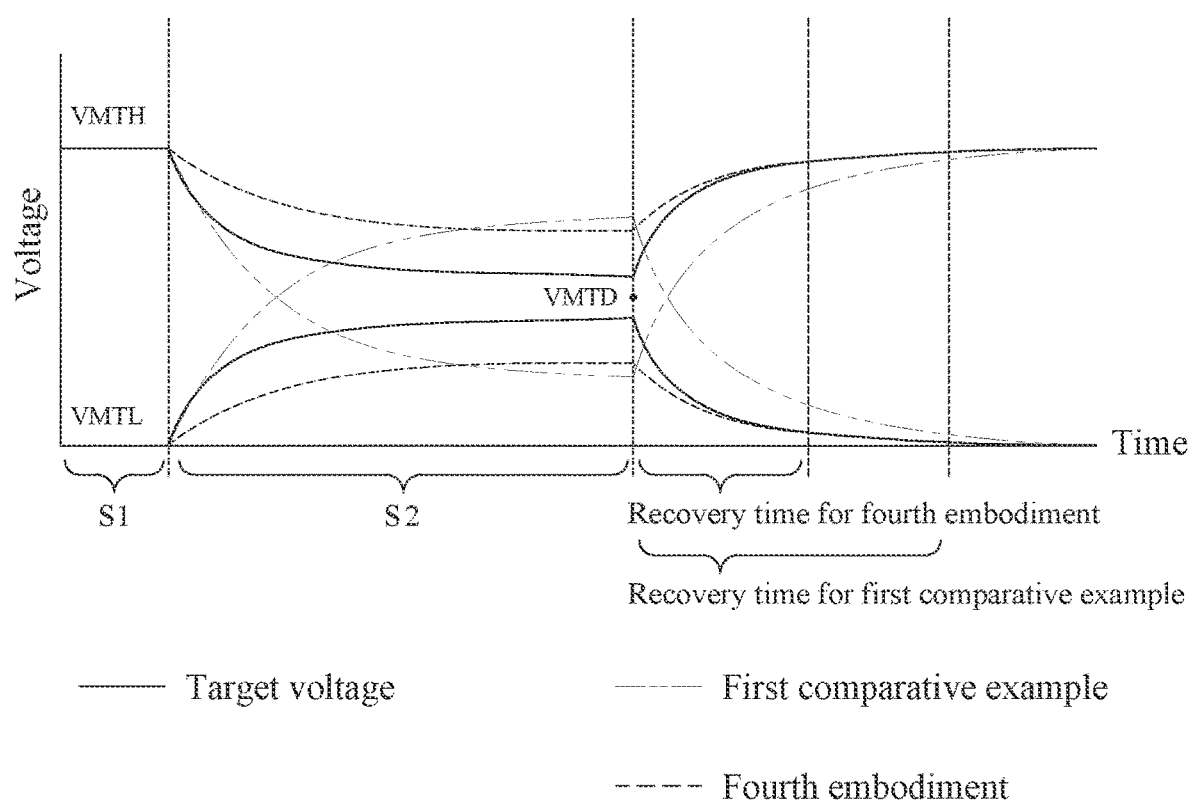
FIG. 12 is a voltage diagram of the semiconductor integrated circuit according to the fourth embodiment of the present invention in an operating state and a voltage-drop state.

Refer to FIG. 11 and FIG. 12, wherein FIG. 11 is a circuit diagram of a semiconductor integrated circuit according to a fourth embodiment of the present invention; and FIG. 12 is a voltage diagram of the semiconductor integrated circuit according to the fourth embodiment of the present invention in an operating state and a voltage-drop state.

As shown in FIG. 11, compared with the second embodiment, the voltage holding circuit 14 according to the fourth embodiment of the present invention comprises control units 50, and the control units 50 are respectively disposed between the logic circuit 12 and the plurality of voltage holding units of the voltage holding circuit 14 to control the ON and OFF of the voltage holding units of the voltage holding circuit 14. As such, when the voltage holding circuit 14 includes a plurality of voltage holding units, the present invention can adjust the ON and OFF of each voltage holding unit of the voltage holding circuit 14 through the control unit 50, so that the voltage of the semiconductor integrated circuit 100 of the fourth embodiment, when switching between the operating state S1 and the voltage-drop state S2, conforms to the predetermined target voltage to achieve the recovery time in the ideal state. As such, the semiconductor integrated circuit has an excellent balance of meeting the predetermined voltage and an excellent recovery rate. Therefore, as shown in FIG. 12, according to the data of the fourth embodiment, the present invention provides a preferred semiconductor integrated circuit 100, in which the voltage of the first floating diffusion point FD1 and the voltage of the second floating diffusion point FD2 can be ensured to satisfy the target voltages, while ensuring the recovery speed to the high voltage threshold VMTH and the low voltage threshold VMTL, to achieve the better stability. The circuits and other characteristics used in the semiconductor integrated circuit 100 of the fifth embodiment are similar to those of the first embodiment, and are not repeated here.

It is worth mentioning that, in the above embodiments, the voltage holding circuit 14 may include a plurality of drain feedback bias circuits formed by field effect transistors, a plurality of diodes or resistors, but the present invention is not limited thereto.

Finally, the technical features of the present invention and the technical effects that can be achieved are assembled as follows:

First, according to the semiconductor integrated circuit 100 of the present invention, the voltage of the floating diffusion point is adjusted by the voltage holding circuit 14 to increase or decrease the voltages of the floating diffusion points and the voltage holding circuit 14 can still stably drive the logic circuit 12 when the switch circuit 11 fails. Thereby, the influence of large inrush current and dynamic voltage drop on the semiconductor integrated circuit 100 is reduced, so as to ensure stable operation of the semiconductor integrated circuit 100.

Second, according to the semiconductor integrated circuit 100 of the present invention, the control unit 50 adjusts the ON and OFF of each voltage holding unit of the voltage holding circuit 14, so that the voltage of the semiconductor integrated circuit 100, when switching between the operating state S1 and the voltage-drop states S2, conforms to the predetermined target voltage, and the recovery time in the ideal state is realized. The semiconductor integrated circuit 100 has an excellent balance of conforming to the predetermined voltage and an excellent recovery rate, and achieves the effect of improving stability.

The above is to illustrate the implementation of the present invention through specific embodiments, those skilled in the art can easily understand other advantages and effects of the present invention from the content disclosed in this specification.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A semiconductor integrated circuit, comprising:
a first switch circuit;
a logic circuit, coupled to the first switch circuit, a first floating diffusion point being defined between the first switch circuit and the logic circuit;
a second switch circuit, coupled to the logic circuit, a second floating diffusion point being defined between the second switch circuit and the logic circuit; and
a voltage holding circuit, coupled to the first floating diffusion point and the second floating diffusion point, and used to adjust voltages of the first and second floating diffusion points to increase or decrease the voltage of the first floating diffusion point and the voltage of the second diffusion floating point;
wherein the voltage holding circuit comprises a plurality of voltage holding units and a plurality of control units, the voltage holding units include a first voltage holding unit and a second voltage holding unit, the first voltage holding unit is coupled to the first floating diffusion point, the second voltage holding unit is coupled to the second floating diffusion point, the control units are disposed between the voltage holding units and the logic circuit, and the control units are used to control ON and OFF of the first and second voltage holding units.

2. The semiconductor integrated circuit according to claim 1, wherein a minimum value of the voltage of the first floating diffusion point is greater than a maximum value of the voltage of the second floating diffusion point.

3. The semiconductor integrated circuit according to claim 1, wherein the first switch circuit and the second switch circuit comprise field effect transistors (FET).

4. The semiconductor integrated circuit according to claim 3, wherein the first switch circuit is a P-type field effect transistor, and the second switch circuit is an N-type field effect transistor.

5. The semiconductor integrated circuit according to claim 1, wherein the logic circuit comprises a first inverting circuit and a second inverting circuit, and the first inverting circuit and the second inverting circuit comprise a complementary metal-oxide-semiconductor (CMOS) circuit, and the CMOS circuit comprises a P-type field effect transistor and an N-type field effect transistor coupled to each other.

6. The semiconductor integrated circuit according to claim 1, wherein the voltage holding units comprise a plurality of diodes.

7. The semiconductor integrated circuit according to claim 1, wherein the voltage holding units comprise a plurality of field effect transistors (FET) drain feedback bias circuits.

8. The semiconductor integrated circuit according to claim 1, wherein the voltage holding units comprise a plurality of resistors.

9. A semiconductor integrated circuit, comprising:
a first switch circuit;
a logic circuit, coupled to the first switch circuit, a first floating diffusion point being defined between the first switch circuit and the logic circuit;
a second switch circuit, coupled to the logic circuit, a second floating diffusion point being defined between the second switch circuit and the logic circuit; and
a voltage holding circuit, coupled to the first floating diffusion point and the second floating diffusion point, and used to adjust voltages of the first and second floating diffusion points to increase or decrease the voltage of the first floating diffusion point and the voltage of the second diffusion floating point;
wherein the voltage holding circuit comprises a plurality of diodes, a plurality of field effect transistor drain feedback bias circuits, or a plurality of resistors.

* * * * *